US009030209B2

(12) United States Patent
Asako

(10) Patent No.: US 9,030,209 B2
(45) Date of Patent: May 12, 2015

(54) FAILURE DETECTING APPARATUS FOR SIGNAL DETECTION APPARATUS

(71) Applicant: Denso Corporation, Kariya, Aichi-pref. (JP)

(72) Inventor: Yosuke Asako, Kariya (JP)

(73) Assignee: Denso Corporation, Kariya (JP)

( * ) Notice: Subject to any disclaimer, the term of this patent is extended or adjusted under 35 U.S.C. 154(b) by 182 days.

(21) Appl. No.: 13/646,889

(22) Filed: Oct. 8, 2012

(65) Prior Publication Data

US 2013/0088241 A1    Apr. 11, 2013

(30) Foreign Application Priority Data

Oct. 7, 2011    (JP) .................................. 2011-222629

(51) Int. Cl.
*G01R 31/06*    (2006.01)
*G01R 27/02*    (2006.01)
(Continued)

(52) U.S. Cl.
CPC ............ *G01R 31/343* (2013.01); *G01R 31/346* (2013.01); *G01R 31/025* (2013.01)

(58) Field of Classification Search
CPC .. G01R 31/346; G01R 31/025; G01R 31/343; G01R 31/06; G01R 31/34; G01R 31/027
USPC ........... 324/76.52, 98, 126–127, 207.18, 202, 324/207.12, 207.16–207.19, 324/207.24–207.25, 224, 226, 241, 509, 324/546–547, 762.05–762.09; 318/656–661; 340/870.36, 870.35, 340/336, 130; 361/42, 36, 63, 78
See application file for complete search history.

(56) References Cited

U.S. PATENT DOCUMENTS 5,610,532 A * 3/1997 Smith ...................... 324/764.01
5,777,468 A * 7/1998 Maher ........................... 324/547
(Continued)

FOREIGN PATENT DOCUMENTS

CN    101534000    9/2009
JP    2000-166205    6/2000
(Continued)

OTHER PUBLICATIONS

Nobuhara Mochikiyo (Inventor). Toyota Motor Corp (Assignee). JP 2000166205 A. (Published Jun. 16, 2000). (Machine Translated).*
(Continued)

*Primary Examiner* — Melissa Koval
*Assistant Examiner* — Felicia Farrow
(74) *Attorney, Agent, or Firm* — Nixon & Vanderhye PC

(57) ABSTRACT

A failure detecting apparatus that detects an isolation failure between a plurality of coils included in a signal detection apparatus. The failure detecting apparatus includes a voltage applying unit that applies a DC voltage to a coil in the plurality of coils; a differential signal generating unit that generates a differential signal from a voltage at the coil and a predetermined voltage; a threshold voltage setting circuit that outputs a threshold voltage; and a comparator that compares the differential signal with the threshold voltage, thereby detecting whether or not an isolation failure exists. The differential signal generating unit includes either first setting unit for setting an absolute value of the differential signal to be amplified with a predetermined gain or second setting unit for setting the predetermined voltage to be different from a ground potential, and the predetermined gain is set to a value different from one and zero.

16 Claims, 6 Drawing Sheets

(51) Int. Cl.
*G01R 27/32* (2006.01)
*G01R 27/28* (2006.01)
*G01R 31/34* (2006.01)
*G01R 31/02* (2006.01)

(56) References Cited

U.S. PATENT DOCUMENTS

| | | | |
|---|---|---|---|
| 6,781,366 B2 * | 8/2004 | Hiramatsu et al. | 324/207.18 |
| 2007/0153436 A1 * | 7/2007 | Pellon et al. | 361/42 |

FOREIGN PATENT DOCUMENTS

| | | | |
|---|---|---|---|
| JP | 2000166205 A * | 6/2000 | |
| JP | 3588499 | 8/2004 | |
| JP | 4122606 | 5/2008 | |
| JP | 4122606 B2 * | 7/2008 | |

OTHER PUBLICATIONS

Nobuhara Mochikiyo (Inventor). JP 2000166205A (also Published as 4122606B2) (English Machine Translation), "Interphase Short Circuit Detector" (Published Jun. 16, 2000).*

Office Action (8 pgs.) dated Jul. 21, 2014 in corresponding Chinese Application No. 201210377962.X with an at least partial English-language translation thereof (13 pgs.).

* cited by examiner

FIG.2A
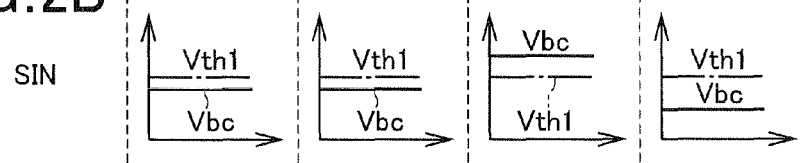
FIG.2B
SIN
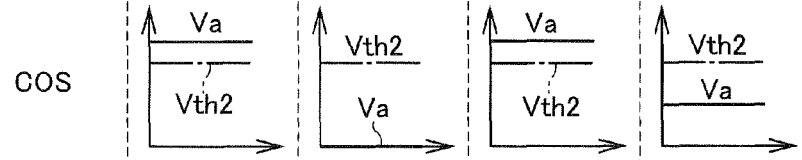
FIG.2C
COS
FIG.2D
WITHOUT INVERTING
AMPLIFICATION
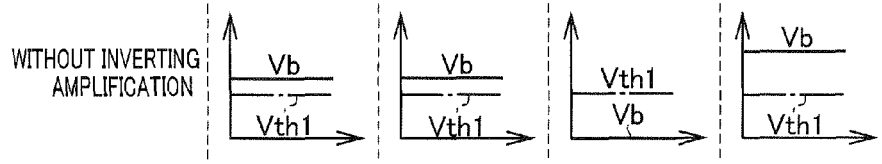

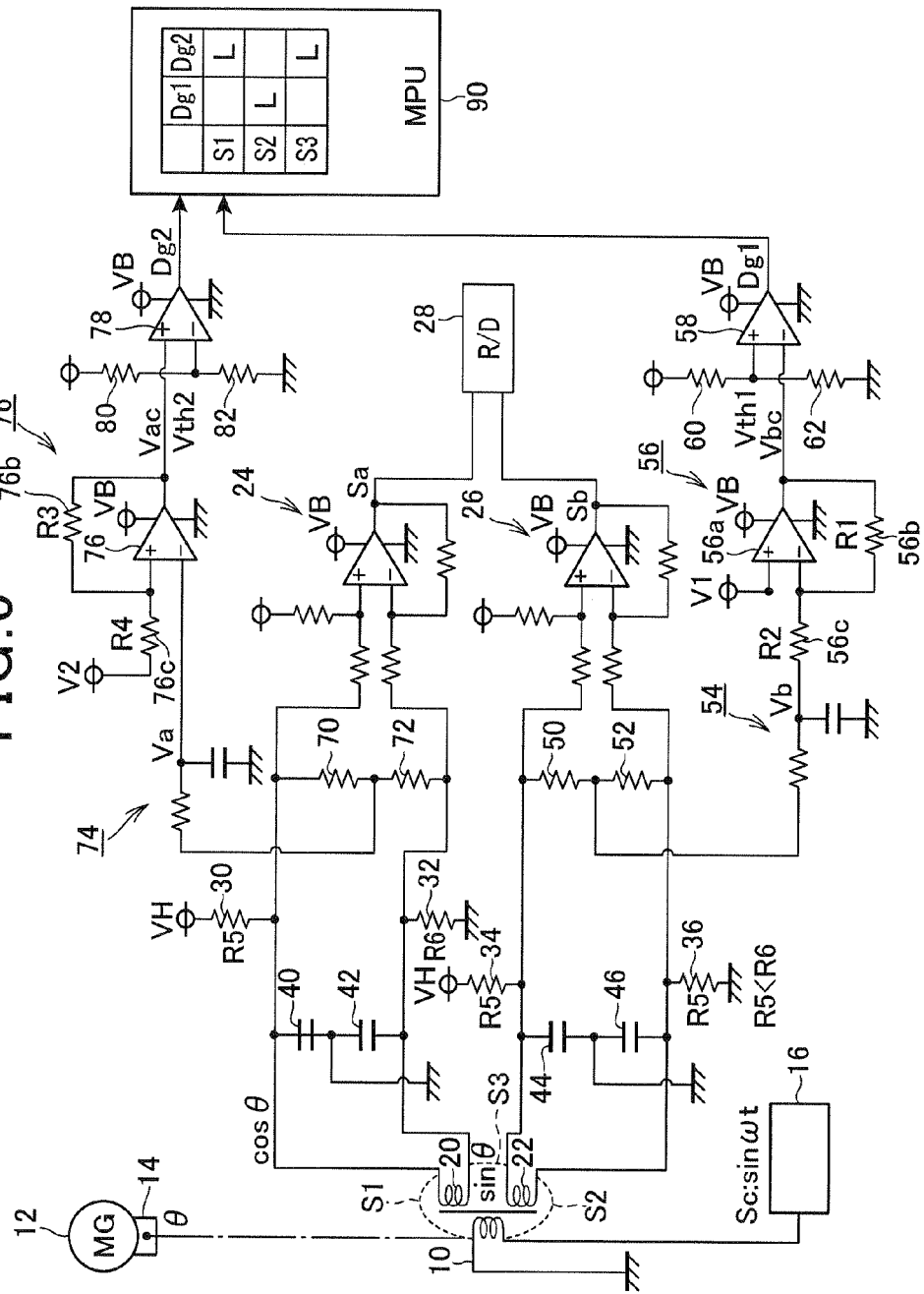

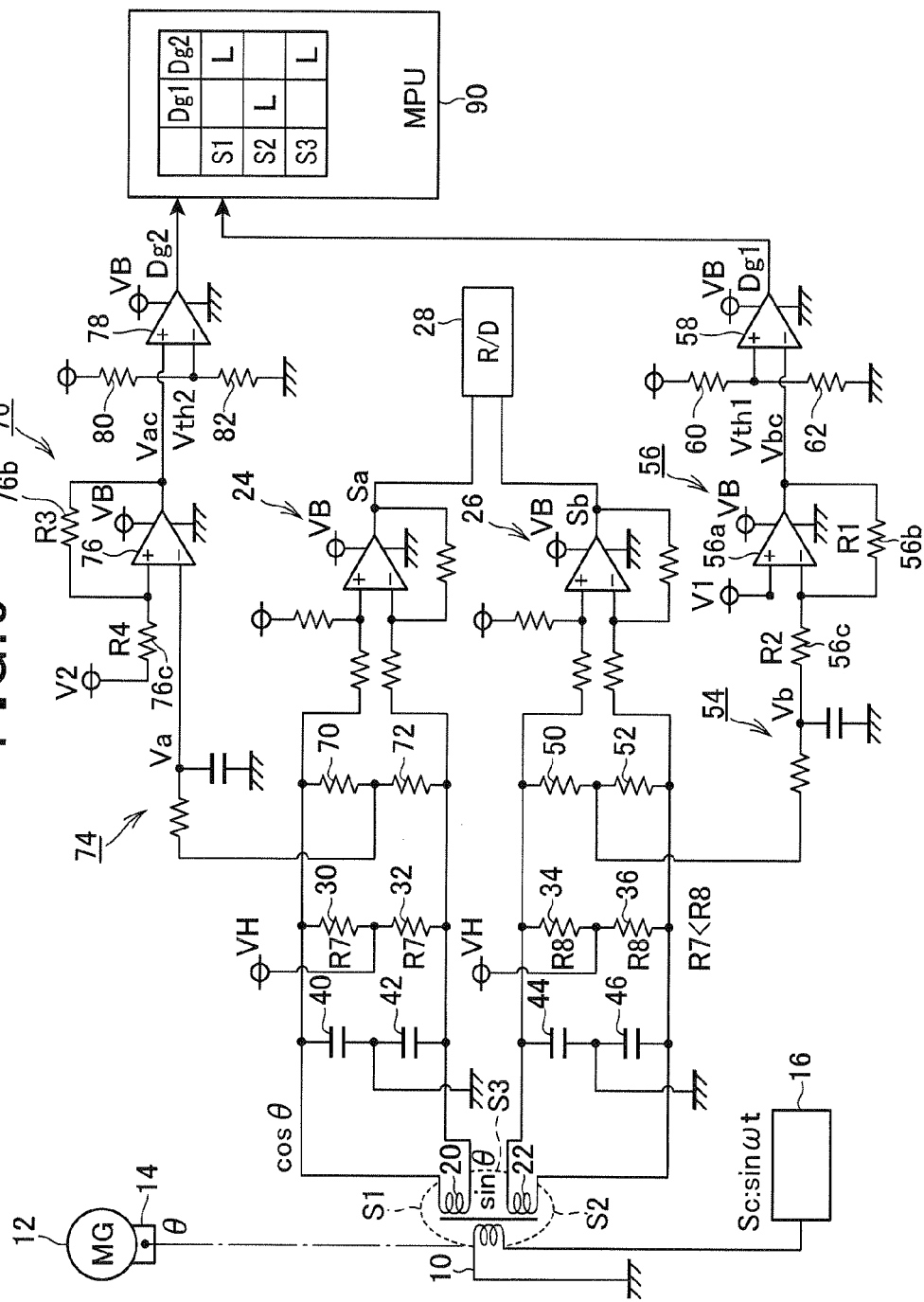

FAILURE DETECTING APPARATUS FOR SIGNAL DETECTION APPARATUS

CROSS REFERENCE TO RELATED APPLICATION

This application is based on and claims the benefit of priority from earlier Japanese Patent Application No. 2011-222629 filed on Oct. 7, 2011 the description of which is incorporated herein by reference.

BACKGROUND

1. Technical Field

The present disclosure relates to failure detecting apparatuses that detect a failure of a signal detection apparatus, and more particularly to a failure detecting apparatus that detects an isolation failure of the signal detection apparatus that detects voltage of a plurality of coils magnetically coupled therebetween.

2. Description of the Related Art

The signal detection apparatus at which the failure detecting apparatus diagnoses whether or not an isolation failure exists, includes one or more primary coils to which alternating current (AC) signal is applied and one or more secondary coils magnetically coupled to the primary coils. The signal detection apparatus detects voltage at the secondary coils.

Particularly, as an example of a failure detecting apparatus, Japanese Patent No. 4122606 discloses a failure detecting apparatus adapted to a resolver as a signal detection apparatus as follows. In the resolver, a magnetic flux is generated by an AC excitation current applied to the primary coil that rotates with the rotor whereby voltage is induced at the secondary coil and therefore, a rotating speed of the rotor is detected by the resolver. The resolver includes the primary coil and a pair of secondary coils which are isolated each other, however, if these coils are short-circuited, a detection accuracy of the rotation speed is decreased. The failure detecting apparatus according to the above patent document is designed to diagnose whether or not a short-circuit has occurred such that individual bias voltage are applied to the primary coil and the secondary coils and whether or not a short-circuit exists is diagnosed based on whether the direct current (DC) potential of the coil with respect to the ground is the bias voltage or more.

However, in the above-described failure detecting apparatus, setting a threshold value in order to determine whether or not the DC potential with respect to the ground is the bias voltage or more depends on the bias voltage. Hence, to flexibly set the threshold value, it is necessary to change the bias voltage. In contrast, when the bias voltage is set in other respects, a range of the threshold value that can be set is narrowed so that a disadvantage such as degrading noise tolerance is likely to occur.

SUMMARY

An embodiment provides a newly developed failure detecting apparatus adapted to a signal detection apparatus including one or more primary coils that receives an AC signal and one or more secondary coils magnetically coupled to the primary coils. The signal detection apparatus detects voltage between both terminals of the secondary coil, and the failure detecting apparatus detects an isolation failure between the coils of the signal detection apparatus.

As a first aspect of the embodiment, a failure detecting apparatus adapted to a signal detection apparatus includes one or more primary coils that receive an AC signal and one or more secondary coils magnetically coupled to the primary coils, the signal detection apparatus detecting voltage between both terminals of the secondary coil, and the failure detecting apparatus detecting an isolation failure between the coils of the signal detection apparatus, the failure detecting apparatus includes: voltage applying means for applying a DC voltage to at least one coil of the signal detection apparatus so as to set a DC potential of the at least one coil is different from any one of DC potential of coils; differential signal generating means for generating a differential signal which is an amplified signal of the difference between the voltage at the at least one coil and a predetermined voltage; a threshold voltage setting circuit that outputs a threshold voltage; and comparing means for comparing the differential signal outputted by the differential signal generating means with the threshold voltage outputted by the threshold voltage setting circuit, thereby detecting whether or not an isolation failure exists. The differential signal generating means is configured to include at least either first setting means for setting an absolute value of the differential signal to be amplified with a predetermined gain or second setting means for setting the predetermined voltage to be different from a ground potential, and the predetermined gain is set to a value different from one and zero.

As described above, when the failure detecting apparatus includes the voltage applying means that applies voltage to the coils, coils have mutually different DC potentials. Assuming an isolation failure occurs among the coils having mutually different DC potentials, these DC potentials may change due to the isolation failure. In the failure detection apparatus, this change is quantified by the differential signal between the predetermined voltage and the voltage at the coil and the quantified signal is compared with the threshold voltage by the comparing means. Therefore, in the comparing means, whether or not an isolation failure exits can be detected based on whether or not the DC potential change has occurred due to an isolation failure.

When the differential signal is generated to be amplified from an absolute value of the above-described differential potential, the resolution of a change in the above-described DC potential can be enhanced. Meanwhile, when the differential signal is generated to be shrunk from an absolute value of the differential potential, an absolute value of the differential signal being excessively high can be avoided. Moreover, when the reference potential is different from the ground potential, flexibility of setting the threshold voltage and allowable input voltage range of the comparing means can be enhanced.

As a second aspect of the embodiment, the differential signal generating means is configured to include both the first setting means and the second setting means.

As a third aspect of the embodiment, the voltage applying means is configured to apply DC voltage to the coil so as to set DC potentials of respective coils to be different from each other.

According to the above-described second and the third aspects of the embodiments, since the DC voltage is applied to the coil so as to set the DC potentials of the respective coils to be different from each other, when the signal detection apparatus includes three or more coils, the DC potentials of the coils would change even when an isolation failure is occurred between any one pair of coils. Therefore, isolation failure of any one pair of coils can be detected.

According to fourth aspect of the embodiment, an inverting amplifier circuit constitutes the differential signal generating means.

Above-described inverting amplifier circuit has a function in which a voltage of the input signal is converted to an output signal. When using this function, appropriate signal level can be secured for the comparing means to determine whether or not a DC potential change has occurred due to an isolation failure. As a result, accuracy of detecting failure can be enhanced. The inverting amplifier circuit further includes a function that inverts polarity of the input signal. Hence, this function is used to convert the input signal to an appropriate signal level for the comparing means to determine whether or not a DC potential change has occurred due to an isolation failure, whereby accuracy of detecting failure can be enhanced.

As a fifth aspect of the embodiment, a non-inverting amplifier circuit constitutes the differential signal generating means.

The above-described non-inverting amplifier circuit has a function in which a voltage of the input signal is converted to an output signal. When using this function, appropriate signal level can be secured for the comparing means to determine whether or not a DC potential change has occurred due to an isolation failure. As a result, accuracy of detecting failure can be enhanced.

As a sixth aspect of the embodiment, the primary coil includes a single coil and the secondary coil includes a pair of coils including a first secondary coil and a second secondary coil. The voltage applying means is configured to apply DC voltage to the coils such that the DC voltage is lowered in the descending order of the first secondary coil, the second secondary coil and the primary coil, and the differential signal generating means is an inverting amplifier circuit that generates the differential signal which is generated from at least a voltage at the second secondary coil.

According to the above-described embodiment, the DC potential of the first secondary coil decreases when an isolation failure occurs between the first secondary coil and the primary coil or when an isolation failure occurs between the first secondary coil and the second secondary coil. Therefore, by detecting a change in the DC potential of the first secondary coil, an isolation failure can be appropriately detected.

Meanwhile, when an isolation failure occurs between the second secondary coil and the primary coil, the DC potential of the second secondary coil decreases, however when an isolation failure occurs between the first secondary coil and the second secondary coil, the DC potential of the second secondary coil increases. When a change in the DC potential change of the second secondary coil is detected in order to detect an isolation failure between the second secondary coil and the primary coil, setting the threshold voltage is restricted to lower value. This restriction can be solved by using the differential signal. However, when the non-inverting amplifier circuit is used as the differential signal generating means, if an isolation failure occurs between the first secondary coil and the second secondary coil, the output voltage may become excessively high. In this regard, according to the above-described embodiments, by using the inverting amplifier circuit, the output voltage being excessively high can be avoided.

As a seventh aspect, the threshold voltage setting circuit outputs first and second threshold voltages to be used for comparing with the differential signal generated by the inverting amplifier circuit. The comparing means is configured to compare the differential signal generated by the inverting amplifier circuit with the second threshold voltage and compare a voltage at the first secondary coil with the second threshold voltage. The first threshold voltage is set to be larger than the output signal of an inverting amplifier circuit that is operating normally and set to be smaller than the output signal of an inverting amplifier circuit where an isolation failure has occurred between the second secondary coil and the primary coil. Further, the second threshold voltage is set to be smaller than the voltage of a first secondary coil that is operating normally and set to be larger than a voltage at the first secondary coil where an isolation failure has occurred between the first secondary coil and the primary coil and an isolation failure has occurred between the first secondary coil and the second secondary coil.

According to the above-described embodiment, when the voltage of the output signal outputted by the inverting amplifier circuit is smaller than the first threshold voltage, it is determined that an isolation failure has occurred between the second secondary coil and the primary coil. Also, when the voltage at the first secondary coil is smaller than the second threshold voltage, it is determined that at least an isolation failure between the first secondary coil and the primary coil or an isolation failure between the first secondary coil and the second secondary coil has occurred.

As an eighth aspect of the embodiment, the differential signal generating means includes the inverting amplifier circuit and a non-inverting amplifier circuit that generates the differential signal which is generated from at least a voltage at the first secondary coil. The threshold voltage setting circuit outputs first and second threshold voltages to be used for comparing with the differential signal generated by the inverting amplifier circuit, the first threshold voltage is set to be larger than an output signal of the inverting amplifier circuit that is operating normally and set to be smaller than an output signal of the inverting amplifier circuit where an isolation failure has occurred between the second secondary coil and the primary coil, and the second threshold voltage is set to be smaller than an output signal of an non-inverting amplifier circuit that is operating normally and set to be larger than an output signal of the non-inverting amplifier circuit where an isolation failure has occurred between the first secondary coil and the primary coil and an isolation failure has occurred between the first secondary coil and the second secondary coil.

According to the above-described embodiment, when the voltage at the output signal of the inverting amplifier circuit is smaller than the first threshold voltage, it is determined that an isolation failure has occurred between the second secondary coil and the primary coil. Also, when the voltage at the output signal of the non-inverting amplifier circuit is smaller than the second threshold voltage, it is determined that at least an isolation failure between the first secondary coil and the primary coil or an isolation failure between the first secondary coil and the second secondary coil has occurred.

BRIEF DESCRIPTION OF THE DRAWINGS

In the accompanying drawings:

FIGS. 2A, 2B, 2C and 2D are diagrams showing a detecting method of an isolation failure according to the first embodiment;

FIG. 5 is a circuit diagram showing a system configuration of modification examples on the basis of the first and second embodiments; and FIG. 6 is a circuit diagram showing a system configuration of modification examples on the basis of the first and second embodiments.

DETAILED DESCRIPTION OF THE PREFERRED EMBODIMENTS

First Embodiment

With reference to the drawings, hereinafter will be described an isolation failure detecting apparatus of a signal detection apparatus, which is adapted to a wire-breakage detecting apparatus of a resolver unit.

Figure 1:
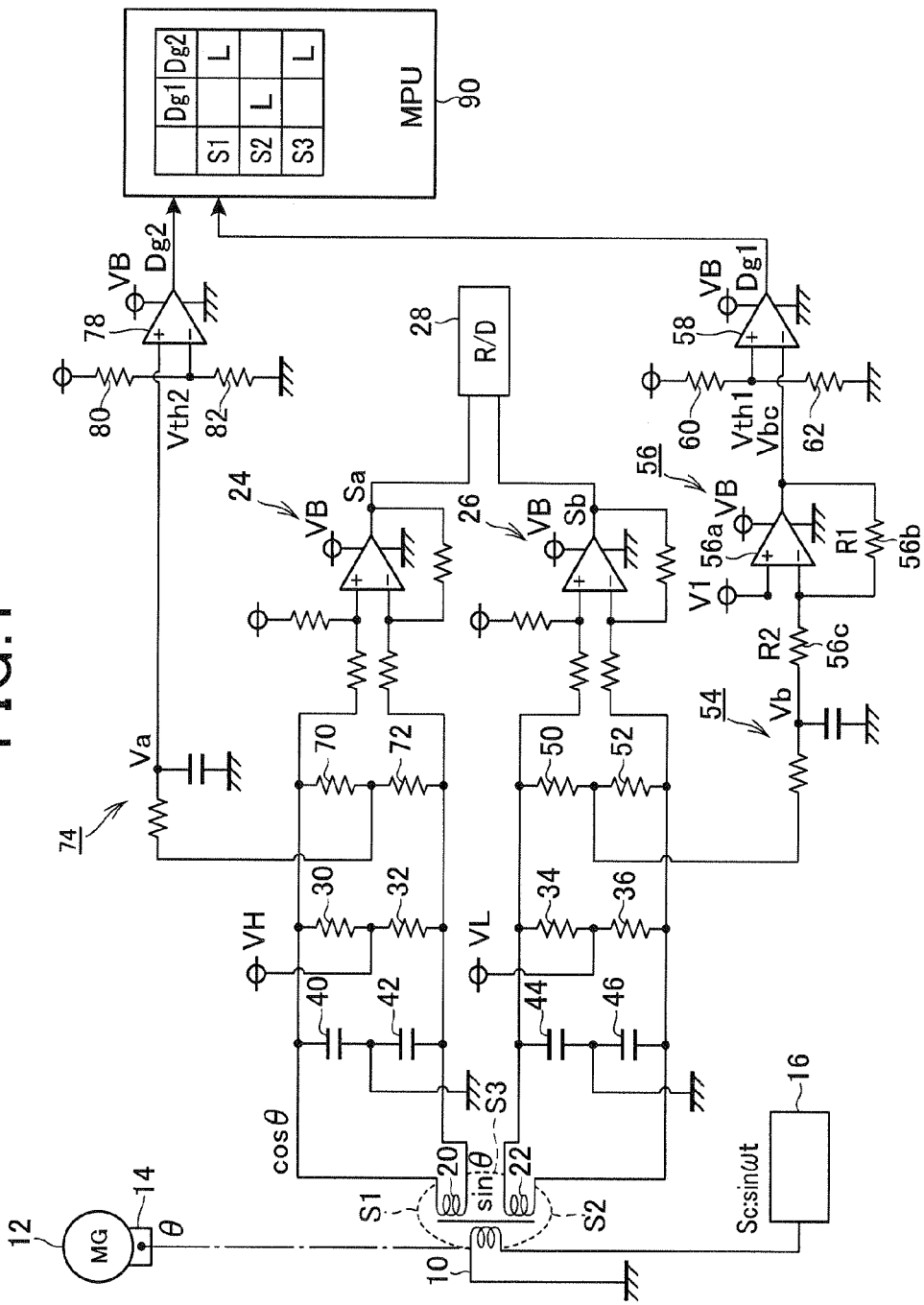
FIG. 1 is a circuit diagram showing a system configuration according to the first embodiment of the present disclosure.
Figure 3:
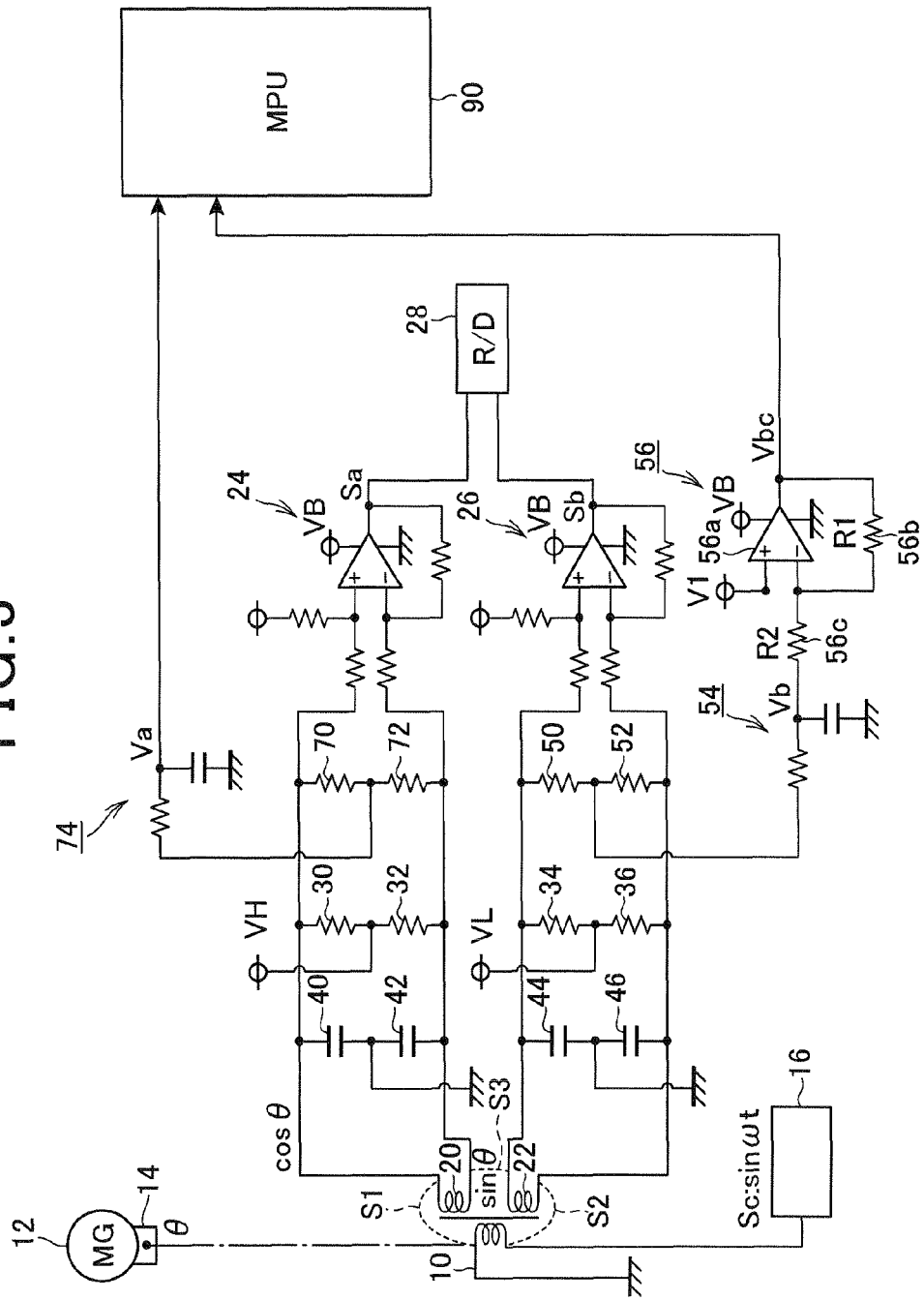
FIG. 3 is a circuit diagram showing a change method in a comparing means according to the first embodiment.

With reference to FIGS. 1 to 3, the first embodiment according to the present disclosure is described herein below.

FIG. 1 is a circuit diagram showing a system configuration of the first embodiment.

The primary coil 10 as shown in FIG. 1 rotates together with a rotor 14 of a motor generator 12. The alternating current (AC) voltage signal (i.e., excitation signal Sc) generated by an excitation signal generation unit 16 is applied to the primary coil 10. The excitation signal Sc applied to the primary coil 10 induces a magnetic flux at the primary coil 10 and the magnetic flux interlinks to a pair of secondary coils 20 and 22. With time, a positional relation between the primary coil 10 and the pair of secondary coils 20 and 22 changes periodically depending on the rotational angle θ of the rotor 14 whereby the flux linkage of the secondary coils 20 and 22 changes periodically. Specifically, geometric configuration between the pair of secondary coils 20 and 22, and the primary coil 10 is designed to be deferent from each other so that the phases of voltage generated at secondary coils 20 and 22 are mutually shifted by phase angle π/2. Therefore, respective output voltages of the secondary coils 20 and 22 become modulated waves where the excitation signal Sc is modulated by modulation waves sin θ and cos θ. In other word, when the excitation signal Sc is sin ωt, the modulated waves are sin θ sin ωt and cos θ sin ωt.

The output voltage of the secondary coil 20 is converted to a voltage, i.e., A phase modulated wave Sa by a differential amplifier circuit 24. The output voltage of the secondary coil 22 is converted to a voltage, i.e., B phase modulated wave Sb by a differential amplifier circuit 26. Each of the A phase modulated wave Sa and the B phase modulated wave Sb is transmitted to a well known resolver digital converter 28.

Next, how to diagnose whether or not an isolation failure exists in the primary coil 10 and the secondary coil 20 and 22 of the first embodiment is described as follows. According to the first embodiment, in order to diagnose an isolation failure, the direct current (DC) potentials of the primary coil 10 and the secondary coil 20 are set to be different from each other. In particular, series-connected-resistors 30 and 32 are connected in parallel to the secondary coil 20 and voltage VH (>0) is applied to the connection point between series-connected resistors 30 and 32. The voltage VH is a potential difference with respect to the ground potential. Regarding the secondary coil 22, series-connected-resistors 34 and 36 are connected in parallel to the secondary coil 22 and voltage VL (<VH) is applied to the connection point between the series-connected-resistors 34 and 36. The voltage VL is a potential difference with respect to the ground potential. Further, one end terminal of the primary coil 10 is connected to the ground so that the DC potential of the primary coil 10 becomes the ground potential. As to the secondary coil 20, to eliminate noise, series-connected-capacitors 40 and 42 are connected in parallel to the secondary coil 20, and the connection point between the series-connected-capacitors 40 and 42 is grounded. Moreover, series-connected-capacitors 44 and 46 are connected in parallel to the secondary coil 22 and the connection point between the series-connected-capacitors 44 and 46 is grounded.

According to the above-described configuration, when an isolation failure occurs between the primary coil 10 and the secondary coil 20, at least DC potentials of the two coils change. Therefore, a quantitative evaluation for a change of the DC potential makes it possible to diagnose whether or not an isolation failure exists between the primary coil and the secondary coils. Hereinafter is described a configuration adapted to perform the quantitative evaluation for a change of the DC potential of the primary and secondary coils.

The series-connected-resistors 50 and 52 connected in parallel to the secondary coil 22 and the connection point of the series-connected-resistors is connected to a RC circuit 54. The RC circuit 54 is a low pass filter that outputs low frequency components of the input voltage being appeared between both ends of the capacitor. The output signal of the RC circuit 54 is a voltage signal responding to the DC potential of the secondary coil 22.

The output signal of the RC circuit 54 is acquired by an inverting amplifier 56. The inverting amplifier 56 includes an operational amplifier (op-amp) 56a, a resistor 56b connected between the inverting input terminal and the output terminal of the op-amp 56, and a resistor 56c connected to the inverting input terminal of the op-amp 56. The non-inverting input terminal of the op-amp 56a is fixed to the voltage potential V1 (≠0) and one end of the resistor 56c which is not connected to the inverting input is assigned to the input terminal of the op-amp. Thus, according to the above-described configuration, the inverting amplifier 56 outputs a voltage signal amplified from a potential difference between the voltage Vb of the output terminal of the RC circuit 54 and a predetermined voltage. The voltage signal is amplified by a predetermined factor determined by the inverting amplifier 56.

Hence, the output voltage of the inverting amplifier 56 is expressed by the following equation (C1) by using the resistance values of the resistors 56b and 56c.

$$(-R1/R2) \times \{Vb - V1 \times (1 + R2/R1)\} \quad (C1)$$

According to the above-described equation (C1), the inverting amplifier 56 outputs a voltage signal in which a voltage difference between the predetermined voltage {V1×(1+R2/R1)} and voltage potential Vb is multiplied by a predetermined gain i.e., (−R1/R2). The output signal of the inverting amplifier 56 is outputted to the inverting input terminal of a comparator 58 as a quantitative signal of the output voltage of the RC circuit 54 (DC potential of the secondary coil 22). A threshold voltage Vth1 is applied to the non-inverting input terminal of the comparator 58. The threshold voltage Vth1 is a voltage signal generated by dividing the power source voltage with the resistors 60 and 62. Also, the threshold voltage Vth1 is set to be larger than the output voltage of the inverting amplifier 56 being outputted when no isolation failure has occurred at the secondary coil 22.

Meanwhile, series-connected-resistors 70 and 72 are connected in parallel to the secondary coil 20 and the connection point between the series-connected-resistors 70 and 72 is connected to a RC circuit 74. The RC circuit 74 is a low pass filter that outputs low frequency components of the input voltage being appeared between both ends of the capacitor. The output signal of the RC circuit 74 is a voltage signal responding to the DC potential of the secondary coil 20.

The output signal of the RC circuit 74 is outputted to the non-inverting input terminal of a comparator 78 as a quantitative signal of the DC potential of the secondary coil 20. A threshold voltage Vth2 is applied to the inverting input terminal of the comparator 78. The threshold voltage Vth2 is a voltage signal generated by dividing the power source voltage with the resistors 80 and 82. The threshold voltage Vth2 is set to be smaller than the output voltage of the RC circuit 74 being outputted when no isolation failure has occurred at the secondary coil 20.

It is noted that a voltage VB of the battery used for the on-vehicle auxiliary unit is applied to the above-described the differential amplifier circuits 24 and 26, the op-amp 56a, and the comparator 58 and 78. Hence, these circuits operate with an operating voltage between the voltage VB and the ground potential.

The above-described comparators 58 and 78 output diagnostic signals Dg1 and Dg2 which are sent to the microprocessor unit (MPU 90). The MPU 90 diagnoses whether or not the above-described isolation failure exists based on the diagnostic signals Dg1 and Dg2 and notify externally (to user) when the isolation failure is detected. With reference to FIG. 2, this control processing is described as follows.

FIG. 2A is diagram showing a relationship between comparison results by the comparator 78 for secondary coil 20 (expressed as COS) and the comparator 58 for the secondary coil 22 (expressed as SIN), and type of failures. In FIG. 2, S1-short, S2-short and S3-short represent a short-circuit between the primary coil 10 and the secondary coil 20, a short-circuit between the primary coil 10 and the secondary coil 22 and a short-circuit between the secondary coils 20 and 22 respectively.

As shown in FIG. 2B, in the normal operation, voltage of the output signal Vbc of the inverting amplifier circuit 56 is lower than the threshold voltage Vth1. Therefore, the output signal (diagnostic signal Dg1) of the comparator 58 becomes logical High. Meanwhile, when the primary coil 10 and the secondary coil 22 are short-circuit (S2-short), the voltage of the output signal Vbc exceeds the threshold voltage Vth1 so that the diagnostic signal Dg1 turn to logical Low. When the secondary coil 20 and 22 are short-circuit, degree of the output signal Vbc decreasing below the threshold voltage Vth1 becomes larger than that in the normal operation, however, the diagnostic signal Dg1 stays logical High.

As shown in FIG. 2C, when in the normal operation, the voltage Va of the output terminal of the RC circuit 74 is higher than the threshold voltage Vth2 so that the output signal (diagnostic signal Dg2) of the comparator 78 turns to logical High. Meanwhile, when the primary coil 10 and the secondary coil 20 are short-circuited (S1-short), the voltage Va decreases below the threshold Vth2 so that the diagnostic signal Dg2 turns to logical Low. Similarly, when the secondary coil 20 and 22 are short-circuit, the voltage Va decreases below the threshold voltage Vth2 so that the diagnostic signal Dg2 turns to logical Low.

According to the above-described embodiment, whether or not the isolation failure exists in the apparatus can be diagnosed. Specifically, according to the first embodiment, the DC potential of the secondary coil 22 which is lower than that of the secondary coil 20 when it is in normal operation is quantified by using the inverting amplifier circuit 56, whereby the accuracy of detecting the isolation failure can be enhanced. Hereinafter is described a method how to enhance the detecting accuracy in more detail.

Here, as an example, it is assumed that each voltage is set as VH=5 volts, VL=2.5 volts, Vth1=3 volts, Vth4=4 volts, VB=8 to 14 volts. The battery voltage VB of the on-vehicle auxiliary unit is not determined to be one value because the terminal voltage varies depending on charge/discharge current.

The operating voltage of the comparator 58 ranges 0 volts to VB. Meanwhile, if the inverting amplifier 56 is not used in the apparatus, the voltage Vb of the output terminal of the RC circuit 54 is 2.5 volts. Therefore, when the inverting amplifier is not used, the threshold voltage Vth1 should be set to be lower than 2.5 volts. This means that the threshold voltage Vth1 is set to be lower voltage side in the operating voltage range of the comparator 58.

Here, the threshold voltage Vth1 can be set to be any value by using a voltage signal where voltage difference between the voltage Vb and a predetermined voltage is converted. The threshold voltage Vth1 can be set to be any value by not only the inverting amplifier circuit 56 but also non-inverting amplifiers. However, when the non-inverting amplifier is used to set the threshold voltage Vth1, setting the threshold voltage Vth1 to be increased may cause an excessive increase of the output voltage of the non-inverting amplifier when the secondary coils 20 and 22 are short-circuited. As a result, accuracy of a diagnostic function to diagnose whether or not an isolation failure exists may be decreased.

In other words, depending on the system specification of the detecting apparatus, as shown in FIG. 3, the system specification may require a configuration in which a comparing means is constituted by a microprocessor unit (MPU) 90 without comparators 58 and 78. In this case, when the non-inverting amplifier circuit is used in the configuration, the output voltage of the non-inverting amplifier circuit becomes excessively high when the secondary coils 20 and 22 are short-circuited whereby the voltage applied to the MPU 90 may exceed the breakdown voltage of the MPU 90. However, as shown in FIG. 2B, according to the detecting apparatus of the first embodiment, the output signal Vbc becomes a signal having smaller voltage potential when the secondary coils 20 and 22 are short-circuited. Hence, the above-described problem does not happen in the configuration of the first embodiment.

Thus, by using the inverting amplifier circuit 56, decreasing accuracy of diagnosing whether or not isolation failure exists can be avoided. Moreover, when comparing to setting the threshold value when the detecting apparatus does not include the inverting amplifier circuit 56 (FIG. 2d), the threshold voltage Vth1 can be increased.

Regarding the resolver, since the voltage applied to the primary coil 10 is larger than that of the secondary coils 20 and 22, by using a power source of the primary coil 10, the DC potentials of the secondary coils 20 and 22 can be significantly changed with respect to the ground potential. Accordingly, the voltage VL can be set to be larger. However, it is necessary to increase the breakdown voltage of a logic circuit which acquires the voltage VL whereby circuit scale may be larger and the manufacturing cost may be increased as well. Further, the power consumption may be increased. According to the first embodiment of the present disclosure, above-described problems can be avoided by using the inverting amplifier circuit 56.

In the first embodiment, the resistors R1 and R2 are set to be 30 ohm and 10 ohm respectively, and the voltage V1 is set to be 2.5 volts. In this case, the gain of the inverting amplifier circuit 56 can be set to be 3 and a change of the DC potential of the secondary coil 22 can be amplified by the inverting amplifier circuit 56. The predetermined voltage $\{V1\times(1+R2/R1)\}$ becomes 3.3 volts and the voltage Vb when the primary coil 10 and the secondary coil 22 are short-circuit becomes 1.9 volts. The voltage Vb is not decreased to 0 volts. This is because the voltage at the non-inverting input terminal of the op-amp 56 is fixed to the voltage V1 so that the voltage of the inverting input terminal is fixed to the voltage V1 as well.

Second Embodiment

With reference to the drawings, hereinafter is described mainly differences between the second embodiment and the above-described first embodiment.

Figure 4:
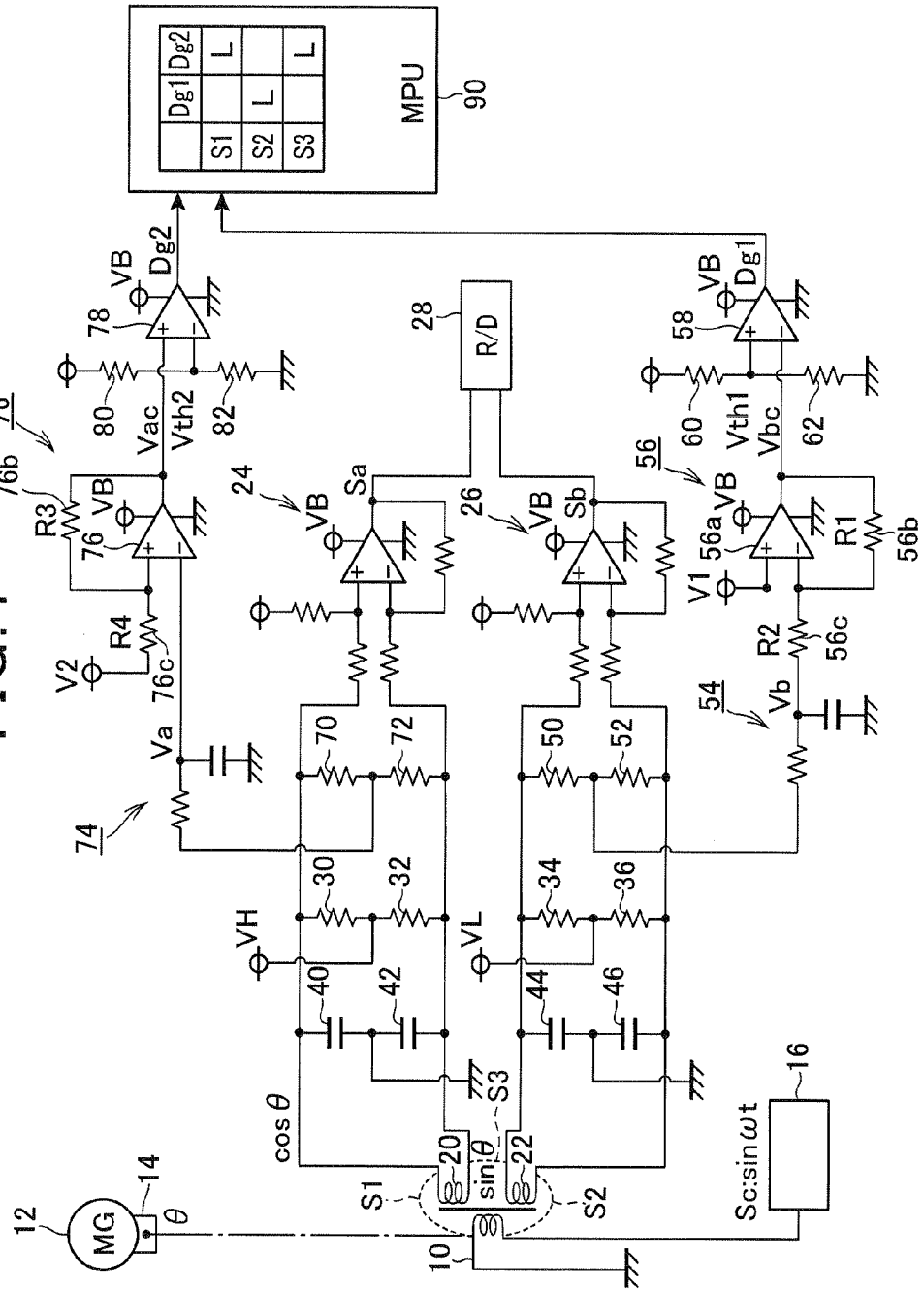
FIG. 4 is a circuit diagram showing a system configuration according to the second embodiment.

FIG. 4 is a block diagram showing a system configuration according to the second embodiment. In FIG. 4, the same reference numbers are added to components used in the first embodiment as shown in FIG. 1.

As shown in FIG. 4, the output voltage of the RC circuit 74 is acquired by the non-inverting amplifier circuit 76. The non-inverting amplifier circuit 76 includes an op-amp 76a, a resistor 76b connected between the inverting input terminal and the output terminal of the op-amp 76a and a resistor 76c connected to the inverting input terminal of the op-amp 76c. The voltage at a terminal of the resistor 76c which is not connected to the inverting input terminal of the op-amp is fixed to a voltage V2 ($\neq$0) and the non-inverting input terminal of the op-amp 56c is assigned to the input terminal of the non-inverting amplifier circuit 76. According to this configuration, the non-inverting amplifier circuit 76 outputs a voltage signal amplified from a potential difference between the output terminal of the RC circuit 74 and a predetermined voltage.

In other words, the output voltage of the non-inverting amplifier circuit 76 calculated when the resistor values R3 and R4 of the resistors 76b and 76c is used, is expressed as following equation (C2).

$$\{1+(R3/R4)\} \times \{Va - V2 \times R3/(R3+R4)\} \quad (C2)$$

According to the above-described equation (C2), the non-inverting amplifier circuit 76 outputs a voltage signal in which a potential difference between the predetermined voltage represented by $V2 \times R3/(R3+R4)$ and the voltage Va is multiplied by $1+(R3/R4)$. The output signal of the non-inverting amplifier circuit 76 which is a quantitative signal of the voltage potential (DC potential of the secondary coil 20) at the output terminal of the RC circuit 74 is transmitted to the non-inverting input terminal of the comparator 78.

According to the above-described configuration, a decrease in the DC potential of the secondary coil 20 caused by an isolation failure can be accurately detected. In other word, the threshold voltage Vth2 can be set to be any value appropriately and an accuracy of comparison with the threshold voltage Vth2 by using the comparator 78 can be improved.

In the normal operation, the output signal Vbc of the inverting amplifier circuit 56 is lower than the threshold voltage Vth1 so that the output signal (diagnostic signal Dg1) becomes logical High. Meanwhile, when the primary coil 10 and the secondary coil 22 are short-circuited (S2-short), the output signal Vbc exceeds the threshold voltage Vth1. Therefore, the diagnostic signal Dg1 turns to logical Low. When the secondary coils 20 and 22 are short-circuit, the degree by which the output signal Vbc deceases below the threshold voltage Vth1 becomes larger than that in the normal operation, however, the diagnostic signal Dg1 stays logic High.

In the normal operation, the output signal Vac of the non-inverting amplifier circuit is higher than the threshold voltage Vth1. Therefore, the output signal of the comparator 78 (diagnostic signal Dg2) turns to logical High. Meanwhile, if the primary coil 10 and the secondary coil 20 are short-circuited (S1-short), the output voltage Vac decreases below the threshold voltage Vth2. Therefore, the diagnostic signal Dg2 turns to logical Low. Similarly, when the secondary coils 20 and 22 are short-circuit, the output voltage Vac decreases below the threshold voltage Vth2 so that the diagnostic signal Dg2 turns to logical Low.

As described, according to the second embodiment, when an isolation failure is detected between the primary coil 10 and the secondary coil 22, the diagnostic signal Dg1 turns to logical Low, and when an isolation failure is detected between the primary coil 10 and the secondary coil 20 or an isolation failure is detected between the secondary coils 20 and 22, the diagnostic signal Dg2 turns to Low.

Other Embodiments

The above-described embodiments can be modified as follows.

As to voltage applying means, regarding the DC voltage to be applied to the primary and secondary coils in the configurations of the above-described embodiments, the DC voltage is applied to the coils such that the DC voltage is lowered in the order of the secondary coil 20, the secondary coil 22 and the primary coil 10. However, the method of applying the DC voltage is not limited to the above-described order. Further, it is not limited to the configuration in which a pair of series-connected resistor is connected to both ends of the coil and the connection point is connected to the DC power source, however, a configuration in which either terminal of the coil can be pulled-up via a resistor is also possible.

It is not limited to the configuration in which the secondary coil 20, the secondary coil 22 and the primary coil 10 are connected to individual power terminals (includes ground terminal) separately, whereby voltage potentials of these coils are different from each other. For example, a configuration as shown in FIG. 5 can be employed. In FIG. 5, the same reference numbers are added to components corresponding to the components as shown in FIG. 4. As shown in FIG. 5, one end terminal of the secondary coil 20 is connected the power terminal of the voltage VH via the resistor 30 and the other terminal is connected to the ground via the resistor 32. Here, the resistors 30 and 36 have the same resistance value R5 and the resistors 32 and 34 have the same resistance value R6 (R6>R5). In this case, the DC potential of the secondary coil 20 becomes approximately a voltage value represented by $VH \times R6/(R5+R6)$ and the DC potential of the secondary coil 22 becomes approximately a voltage value represented by $VH \times R5/(R5+R6)$.

Similarly, a configuration as shown in FIG. 6 can be employed. In FIG. 6, the same reference numbers are added to components corresponding to the components as shown in FIG. 4. As shown in FIG. 6, the resistors 30 and 32 have the same resistance value R7 and the resistors 34 and 36 have the same resistance value R8 (R8>R7). In this case, the differential amplifiers 24 and 26, the RC circuits 54 and 74, the inverting amplifier circuit 56 and the non-inverting amplifier circuit 76 influence to cause the DC potentials of the secondary coils 20 and 22 being mutually different.

As to differential signal generating means, the inverting amplifier circuit 56 can be omitted.

Moreover, it is not limited to amplify the differential voltage, however, regarding the inverting amplifier 56, as shown in the above-described equation (C1), the gain R1/R2 can be set to be smaller than one and larger than zero. This setting is effective to limit the absolute value of the voltage received at the MPU 90 being excessively high.

Even when a signal having an absolute voltage value equivalent to the differential signal is employed, by adjusting the predetermined voltage, flexibility of setting the threshold voltage and the comparing means can be enhanced.

Further, even when the predetermined voltage is set to be the ground voltage, if the differential voltage is amplified, the accuracy of detecting a change of the DC potential can be enhanced. Also, assuming an absolute value of the differential voltage is converted to be shrunk, excessively high voltage being applied to the comparing means can be avoided.

As to the threshold setting circuit, it is not limited to a configuration in which the power supply voltage is divided by a pair of resistor so as to generate the threshold voltage, however, a terminal voltage of the power supply voltage can be used as the threshold voltage.

Regarding the comparing means, in the above-described embodiment (FIG. 4), the MPU 90 can be used instead of the analog circuit (comparator 58 and 78). In this case, it is preferable to appropriately set the gain of the differential signal generating means and the above-described predetermined voltage in order to have the output voltage of the differential signal generating means (i.e., non-inverting amplifier circuit 76 or the inverting amplifier circuit 56) adapt to a resolution of the analog-digital converter in the MPU 90 and the breakdown voltage. It is noted that the output voltages of the non-inverting amplifier circuit 76 and the inverting-amplifier circuit 56 are limited to the power supply voltage thereof (0 volts to VB in FIG. 4). Therefore, by appropriately setting the power supply voltage, voltage applied to the MPU 90 being excessively high or low can be avoided.

When setting the DC potential, it is not limited to a situation where the DC potentials of the all coils are different from each other. For example, the DC voltage is only applied to the secondary coil 20 so that the DC potential of the secondary coil 20 becomes different from that of the primary coil 10 and the secondary coil 22. However, DC potentials of the primary coil 10 and the secondary coil 22 can be the same value. Even in this case, an isolation failure between the secondary coils 20 and 22 can be detected by the diagnostic signal Dg2 outputted by the comparator 78.

As to the signal detection apparatus, the resolver unit is not limited to the one having a pair of secondary coils For example, as described in 'Theory and Designing Practice of AC Servo System, written by Hidehiko Sugimoto, Sogo Denshi Publishing', the resolver unit can include a pair of primary coil and a single secondary coil.

The signal detection apparatus is not limited to the resolver unit.

What is claimed is:

1. A failure detecting apparatus adapted to a signal detection apparatus including a primary coil that receives an AC signal and a secondary coil magnetically coupled to the primary coils, the primary coil comprising a single coil and the secondary coil comprising a pair of coils including a first secondary coil and a second secondary coil, the signal detection apparatus detecting voltage between both terminals of the secondary coil, and the failure detecting apparatus detecting an isolation failure between the coils of the signal detection apparatus, the isolation failure including a short-circuit between the primary coil and the first secondary coil, a short-circuit between the primary coil and the second secondary coil and a short-circuit between the first secondary coils and a second secondary coil, the failure detecting apparatus comprising:

voltage applying means for applying a DC voltage to at least one coil of the signal detection apparatus so as to set a DC potential of the at least one coil to be different from any other one of DC potential of the coils;

differential signal generating means for generating a differential signal which is an amplified signal of the difference between the voltage at the at least one coil and a predetermined voltage;

a threshold voltage setting circuit that outputs a threshold voltage; and comparing means for comparing the differential signal outputted by the differential signal generating means with the threshold voltage outputted by the threshold voltage setting circuit, thereby detecting whether or not the isolation failure exists based on the comparing, wherein the differential signal generating means is configured to include at least either first setting means for setting an absolute value of the differential signal to be amplified with a predetermined gain or second setting means for setting the predetermined voltage to be different from a ground potential, and the predetermined gain is set to a value different from one and zero.

2. The failure detecting apparatus according to claim 1, wherein the differential signal generating means is configured to include both the first setting means and the second setting means.

3. The failure detecting apparatus according to claim 1, wherein the voltage applying means is configured to apply DC voltage to the coil so as to set DC potentials of respective coils to be different from each other.

4. The failure detecting apparatus according to claim 2, wherein the voltage applying means is configured to apply DC voltage to the coil so as to set DC potentials of respective coils to be different from each other.

5. The failure detecting apparatus according to claim 1, wherein an inverting amplifier circuit constitutes the differential signal generating means.

6. The failure detecting apparatus according to claim 2, wherein an inverting amplifier circuit constitutes the differential signal generating means.

7. The failure detecting apparatus according to claim 3, wherein an inverting amplifier circuit constitutes the differential signal generating means.

8. The failure detecting apparatus according to claim 1, wherein a non-inverting amplifier circuit constitutes the differential signal generating means.

9. The failure detecting apparatus according to claim 2, wherein a non-inverting amplifier circuit constitutes the differential signal generating means.

10. The failure detecting apparatus according to claim 3, wherein a non-inverting amplifier circuit constitutes the differential signal generating means.

11. The failure detecting apparatus according to claim 1, wherein
the voltage applying means is configured to apply DC voltage to the coils such that the DC voltage is lowered in order of the first secondary coil, the second secondary coil and the primary coil, and
the differential signal generating means is an inverting amplifier circuit that generates the differential signal which is generated from at least a voltage at the second secondary coil.

12. The failure detecting apparatus according to claim 2, wherein
the voltage applying means is configured to apply DC voltage to the coils such that the DC voltage is lowered in order of the first secondary coil, the second secondary coil and the primary coil, and
the differential signal generating means is an inverting amplifier circuit that generates the differential signal which is generated from at least a voltage at the second secondary coil.

13. The failure detecting apparatus according to claim 3, wherein
the voltage applying means is configured to apply DC voltage to the coils such that the DC voltage is lowered in order of the first secondary coil, the second secondary coil and the primary coil, and the differential signal generating means is an inverting amplifier circuit that generates the differential signal which is generated from at least a voltage at the second secondary coil.

14. The failure detecting apparatus according to claim 5, wherein the voltage applying means is configured to apply DC voltage to the coils such that the DC voltage is lowered in order of the first secondary coil, the second secondary coil and the primary coil, and the differential signal generating means is an inverting amplifier circuit that generates the differential signal which is generated from at least a voltage at the second secondary coil.

15. The failure detecting apparatus according to claim 11, wherein the threshold voltage setting circuit outputs first and second threshold voltages to be used for comparing with the differential signal generated by the inverting amplifier circuit, the comparing means is configured to compare the differential signal generated by the inverting amplifier circuit with the second threshold voltage and compare a voltage at the first secondary coil with the second threshold voltage, the first threshold voltage is set to be larger than an output signal of the inverting amplifier circuit that operates normally and set to be smaller than an output signal of the inverting amplifier circuit where an isolation failure is occurred between the second secondary coil and the primary coil, and the second threshold voltage is set to be smaller than a voltage at the first secondary coil that operates normally and set to be larger than a voltage at the first secondary coil where an isolation failure has occurred between the first secondary coil and the primary coil and an isolation failure has occurred between the first secondary coil and the second secondary coil.

16. The failure detecting apparatus according to claim 11, wherein the differential signal generating means includes the inverting amplifier circuit and a non-inverting amplifier circuit that generates the differential signal which is generated from at least a voltage at the first secondary coil, the threshold voltage setting circuit outputs first and second threshold voltages to be used for comparing with the differential signal generated by the inverting amplifier circuit, the first threshold voltage is set to be larger than an output signal of the inverting amplifier circuit that operates normally and set to be smaller than an output signal of the inverting amplifier circuit where an isolation failure has occurred between the second secondary coil and the primary coil, and the second threshold voltage is set to be smaller than an output signal of the non-inverting amplifier circuit that is operating normally and set to be larger than an output signal of the non-inverting amplifier circuit where an isolation failure has occurred between the first secondary coil and the primary coil and an isolation failure has occurred between the first secondary coil and the second secondary coil.

\* \* \* \* \*